United States Patent [19]

Drummond

[11] Patent Number: 5,535,906
[45] Date of Patent: Jul. 16, 1996

[54] MULTI-PHASE DC PLASMA PROCESSING SYSTEM

[75] Inventor: Geoffrey N. Drummond, Fort Collins, Colo.

[73] Assignee: Advanced Energy Industries, Inc., Fort Collins, Colo.

[21] Appl. No.: 380,621

[22] Filed: Jan. 30, 1995

[51] Int. Cl.$^6$ ..................................................... B44C 1/22
[52] U.S. Cl. ........................ 216/67; 156/643.1; 156/345
[58] Field of Search .................. 216/67, 71; 156/643.1, 156/662.1, 345 P; 437/228 PE; 204/298.06, 298.34; 363/15, 17

[56] References Cited

U.S. PATENT DOCUMENTS

| | | | |
|---|---|---|---|
| 4,314,324 | 2/1982 | Anderson et al. | 363/90 |
| 4,448,659 | 5/1984 | Morrison, Jr. | 204/192 |
| 4,559,125 | 12/1985 | Mularie | 204/296 |
| 4,700,372 | 10/1987 | Tsuchiya | 378/105 |
| 4,711,767 | 12/1987 | Diederich | 422/186.29 |
| 4,936,960 | 6/1990 | Siefkes et al. | 204/192.38 |
| 4,963,238 | 10/1990 | Siefkes et al. | 204/192.12 |
| 4,971,667 | 11/1990 | Yamazaki et al. | 204/298.34 X |
| 5,009,764 | 4/1991 | Siefkes et al. | 204/298.08 |
| 5,153,821 | 10/1992 | Blaswko | 363/41 |
| 5,206,802 | 4/1993 | Blasko | 363/41 |
| 5,228,939 | 7/1993 | Chu | 204/298.34 X |
| 5,367,448 | 11/1994 | Carroll | 363/89 |
| 5,410,122 | 4/1995 | Su et al. | 204/298.34 X |

OTHER PUBLICATIONS

Douglas S. Schatz, President, Advanced Energy Industries, Inc., "The MDX as a Strategic Tool in Reducing Arcing," 7 pages.
Product Information Sheet for Advanced Energy Industries, Inc.'s MDX–10K Series DC Magnetron Drives, 1988, 2 pages.
Thomas C. Grove, Advanced Energy Industries, Inc., "Arcing Problems Encountered During Sputter Deposition of Aluminum," 5 pages.
S. Beisswenger, T. Krug, R. Kukla, R. Ludwig and M. Luebbehusen, Leybold AG, Hanau, Germany, "Economical Consideration on Modern Web Sputtering Technology," Society of Vacuum Coaters, 35th Annual Technical Conference Proceedings (1992), pp. 128–134.
L. Anderson, Halmar Electronics, Inc., Columbus, OH, "A New Technique for Acr Control in DC Sputtering," Society of Vacuum Coaters, 35th Annual Technical Conference Proceedings (1992), pp. 325–327, 329.

Primary Examiner—William Powell
Attorney, Agent, or Firm—Luke Santangelo

[57] ABSTRACT

A multiple phase switch mode plasma processing system generates alternating signals which may be coincidentally rectified or otherwise converted from AC to DC. The resulting DC signal has extremely reduced ripple and thus greatly reduced need for filtering of the generated DC output. Direct connection of the DC output is possible through a coupling having no substantially no reactive component. In situations where filtering is desirable the filtering can be reduced to about 1% of the energy supplied per cycle. This allows more accurate control of the power supply to the processing plasma. In addition, voltage regulation through frequency variation, resonance, circuit variation, and pulse width modulation can be utilized individually or in combination. The phase relationship of the multiple alternating signals may be determined so as to allow a regular phase relationship and thus minimize the small amount of ripple remaining.

66 Claims, 9 Drawing Sheets

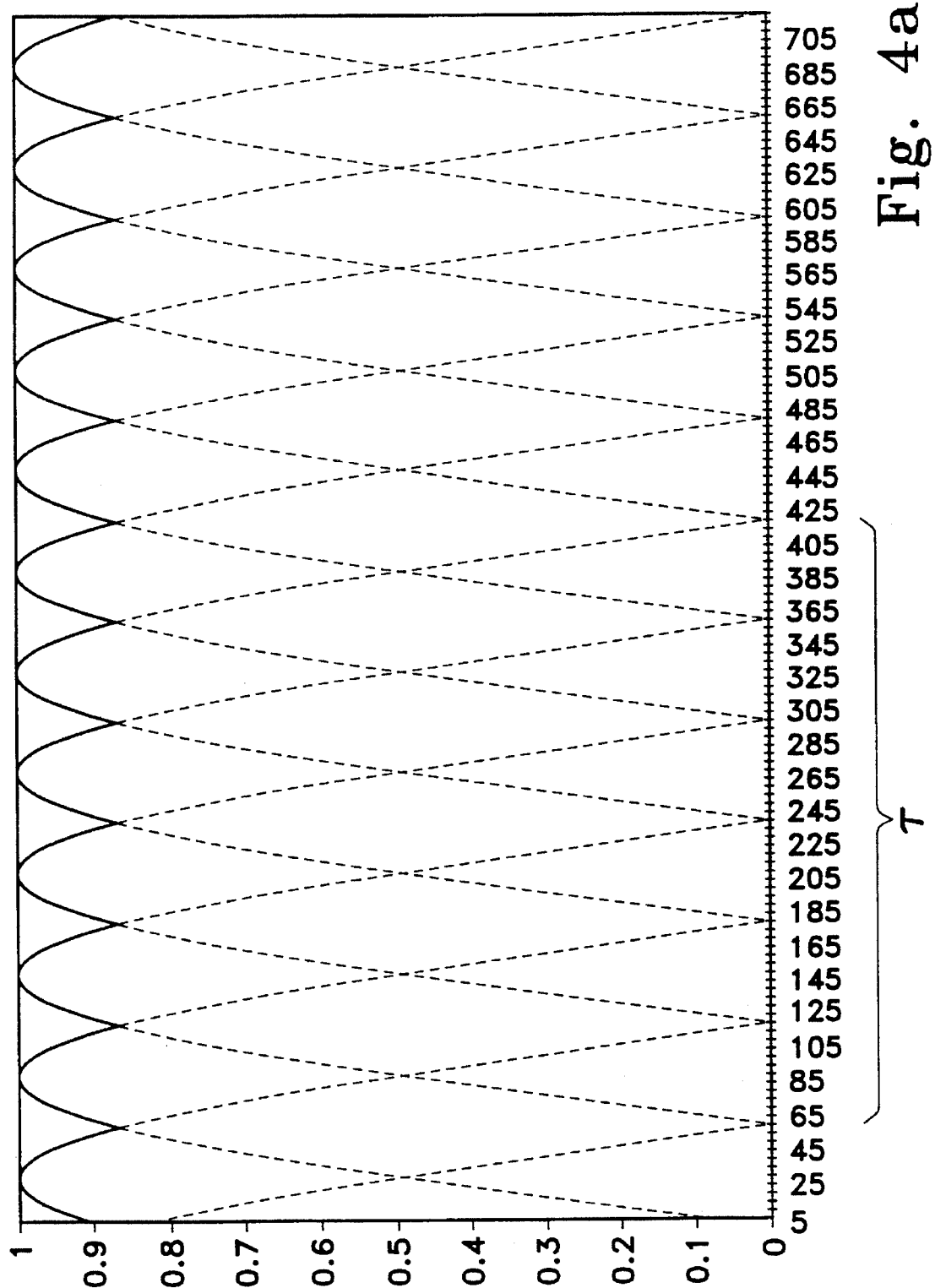

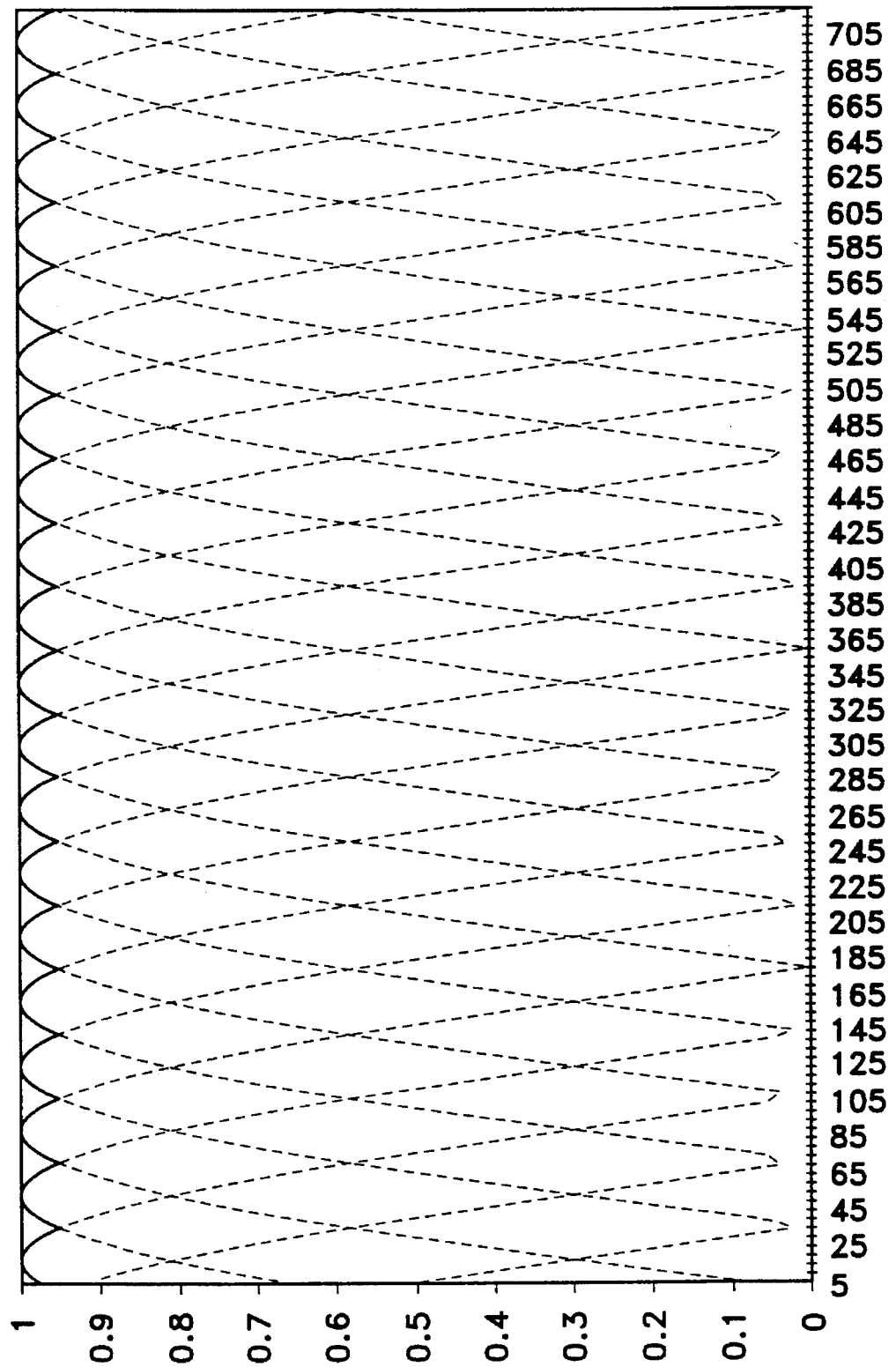

MULTI-PHASE DC PLASMA PROCESSING SYSTEM

BACKGROUND OF THE INVENTION

This invention relates generally to the field of thin film processing through the use of a direct current (DC) plasma. Specifically the invention relates to applications of such processing for which very accurate control of the processing plasma is required. It also discloses a new switch-mode power supply design as is often used in such applications.

The field of DC plasma processing for thin film applications is one which is well known. In these processes, a DC power supply creates an electric potential which causes the existence of a plasma. The plasma then acts upon some material so as to cause processing of an item or substrate. This processing may be the deposition of some substance on the substrate. It may also be some type of etching or conditioning of the surface of the substrate. Naturally, both the materials, substrates, and the nature of the processing can vary greatly. Such applications may range from the creation of microchips to the aesthetic coating of items.

One of the unique challenges in this field is that it can require an unusually precise control of the electrical power applied to the plasma. Unlike other fields where loose control or even the mere existence of the plasma is sufficient to achieve the desired goal, the fact that thin film processing can be as subtle as the creation of a single atomic layer has resulted in unusually strict power control requirements. For this reason, the techniques and systems utilized in other applications (such as those involved in X-Ray generation, evaporative processing, and the like) have not been considered pertinent to this unique area.

One of the ways in which those skilled in the field of DC plasma thin film processing have achieved the degree of power control required has been through the use of a specific type of power supply known as a switch mode power supply. In such a device, the DC power source is seemingly redundantly converted to an AC signal and then reconverted back to a DC signal. By making the intervening AC signal have a higher frequency, relatively quick and accurate control can exist. In addition such switch mode power supplies are often used in this unique field because of the low stored energy necessary to smooth the ripple in the final waveform compared to energy stored in conventional power supplies.

Low stored energy has become an important facet of the DC plasma processing field because the plasma often has arcs occur within it. As such plasma processing applications have become more demanding, the existence of and impacts of arcing within the plasma have been magnified. When arcs and other lower impedance conditions occur in the processing plasma, application of all the energy stored in the output circuitry of the power supply can be discharged into the arc. This can not only cause damage to the system, but it can create defects in the eventual product. Further, these arcs may require the immediate shut off and slightly delayed reinstitution of the application of the power. The amount of time necessary to discharge and then re-charge traditional filter components before reapplying the power is often unacceptable. Thus in general, by lowering the amount of stored energy necessary to smooth ripple, both the system and the end product can be improved.

As mentioned, switch mode power supplies are often used in such applications because they not only offer rapid control, but they can also store lower amounts of energy. The processing demands have evolved, however, to a point at which even the enhanced performance of traditional switch mode power supplies is not enough. The amount of time it takes to stop and restart the application of power, the amount of ripple existing, and even the reduced amount of energy stored in such power supplies has become unacceptable for many applications. As a result those skilled in the art of thin film processing through the use of a DC plasma have sought to improve the switch mode power supplies used. Generally this has been directed toward increasing the frequency at which the intermediate alternating signal is generated. Unfortunately, this direction of pursuit has not always met the needs of the users for a number of reasons.

First, increasing the frequency of the intermediate alternating signal is practically limited by the speed at which the switches which generate the alternating signal can operate. While faster switches are continually developed, they can be overly expensive or can have limits to the amount of power they can transmit. Perhaps even more fundamentally limiting however, is the fact that the utilization of a filter to reduce ripple is counterproductive since such filtering is accomplished through a storage of energy. This energy still reaches the plasma after the system has been shut down. While those skilled in the art have known this aspect, it has previously been viewed as a necessary evil to creating a low ripple output.

Both the amount of energy stored in such filter components and the amount of time needed to charge or discharge these components have generally been viewed as virtually a physical limitation which was immutable. Thus, those skilled in the art had most often approached the need for more accurate energy control by increasing the frequency of the switching circuits in the switch mode power supply. Since this type of approach does have the incidental effect of reducing the amount of energy needed to be stored in the filter elements of the output circuits, this type of solution was generally preferred. As this frequency has increased, however, the cost of the power supply has increased. Further, parasitic elements within the supply have become increasingly important and have further added to the cost of the construction of the supply. There are also limitations on how high the frequency can be extended due to the lack of availability of components capable of high power operations. In addition, power supply losses have also increased due to intrinsic limitations of practically available components. For these reasons the mere increase in the frequency of the switch mode power supply has not been adequate to meet the more demanding needs.

In sharp contrast, the present invention takes an entirely different approach and in fact shows that the amount of energy stored in an output stage filter is not an immutable given but can be extremely reduced or even eliminated through a different approach to the problem. Filtering need not be viewed as a necessary evil but rather it is a component which can even be totally eliminated from some circuit designs. The approach taken by the present invention is surprising not only from the perspective of the preconceptions that those in the field had, but also as a result of the fact that it utilizes technology and elements which had been long been available to those skilled in the art. While those skilled in the art had long felt the need to overcome these problems, they did not realize the possibility existed to use technology developed for another purpose (power transmission over long distances) which could be applied to this problem. This could be because the preconceptions and approaches typically used by those skilled in this art may have actually acted to teach away from the direction of the present invention.

SUMMARY OF THE INVENTION

Accordingly, the present invention provides a DC plasma processing system which has a greatly reduced and even eliminated filter elements while yet maintaining low ripple in its DC output. Fundamentally, the switch mode power supply element of the processing system acts to generate multiple alternating signals which may be phased. These multiple alternating signals are then converted into a single DC output in such a manner that the resulting DC output automatically has extremely low ripple characteristics. Not only does this plasma processing system provide the advantages attendant to a higher frequency switch mode design, but it also provides the advantage of minimizing and even eliminating most of the storage of energy in the output circuits. Thus, the supply of power can be more rapidly stopped and reinstated as is often required in more demanding applications.

It is an object of the invention to provide a plasma processing system which allows an even greater degree of accuracy in the control of power applied to the plasma. Thus, one goal of the invention is to allow for faster turn-on and turn-off of the system as experienced by the plasma itself. In keeping with this goal, the invention achieves the goal of minimizing the amount of charging necessary to start the application of power as well as minimizing the amount of power discharged into the plasma after controls have acted to stop that application of power. Yet another goal is to reduce the damage and impacts that arcing may have on both the system and the actual processing being accomplished by the system.

A further object of the invention is to provide a plasma processing system which has low ripple in its output without increasing the amount of energy stored in the output circuitry of plasma processing system. Similarly (and merely from a different perspective) is the object of decreasing the amount of energy stored without negatively impacting the ripple existing within the plasma processing system.

Yet another object of the invention is to provide a design which is efficient and cost effective. In keeping with this object it is a goal to provide a design which can utilize typical switch components while providing a high frequency with a high degree of power control. Thus a goal is to achieve a high level of performance while avoiding the incidental design impacts and component impacts which are attendant with higher frequency switch mode operation.

Naturally, further objects of the invention are disclosed throughout other areas of the specification and claims.

BRIEF DESCRIPTION OF THE DRAWINGS

FIG. 4a–c are unfiltered waveforms of a variety of embodiments of the present invention showing the impacts of additional phase generation.

DETAILED DESCRIPTION OF THE PREFERRED EMBODIMENT

Figure 2A:
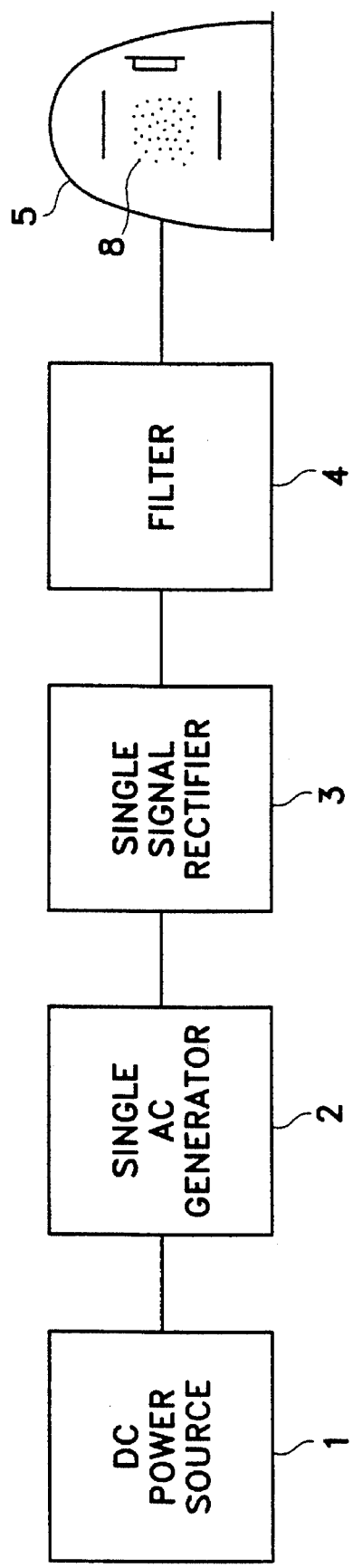
FIG. 2a is a schematic diagram of the basic components of a prior art switch mode DC plasma processing system.
Figure 3:
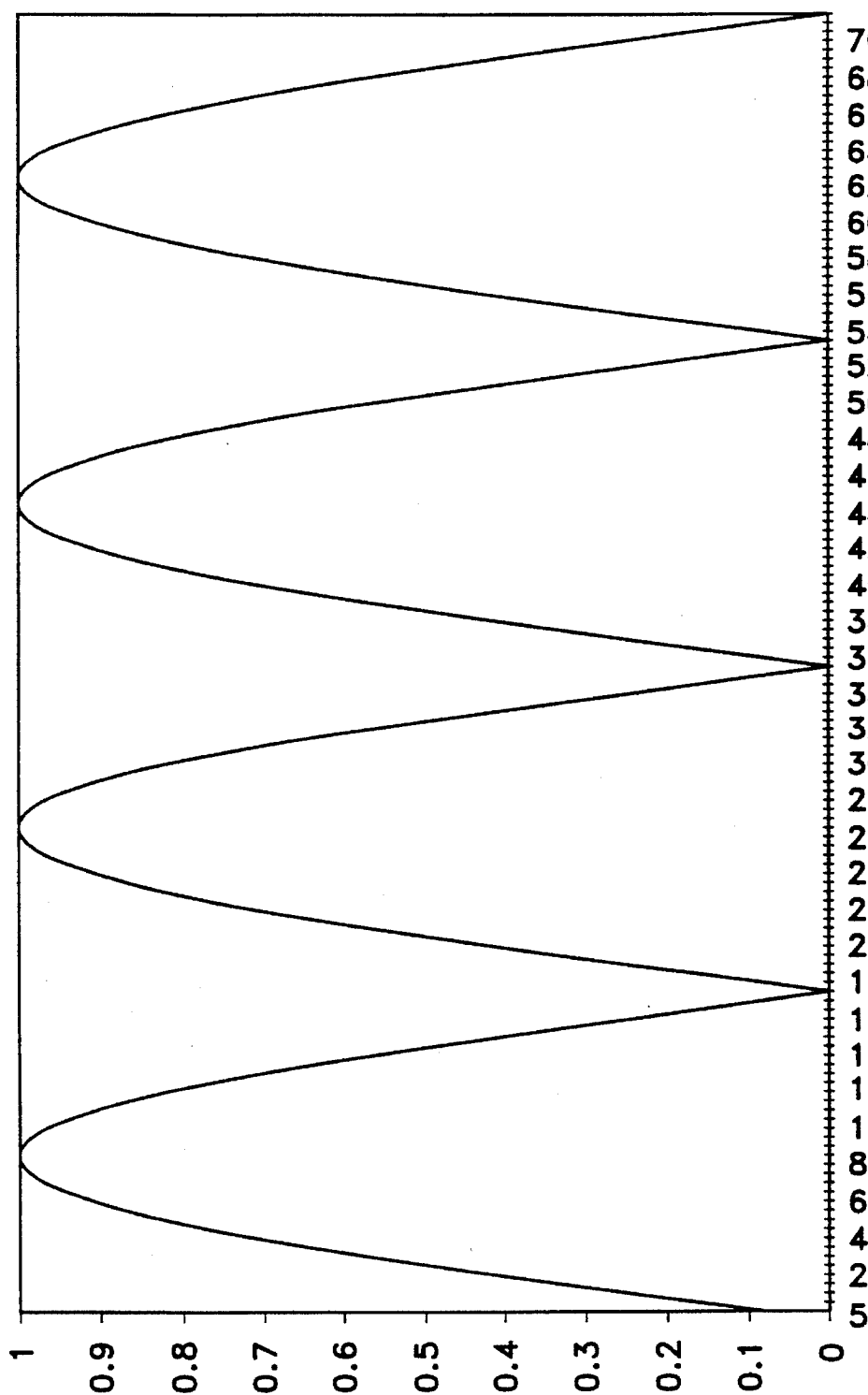
FIG. 3 is an unfiltered waveform of the prior art.

As mentioned, the invention presents an improved plasma processing system. The improvements can be most easily understood by comparison to the prior art. FIG. 2a shows schematically the basic components of a prior art system. As shown, some type of DC power source (1) supplies a DC input voltage to a single AC generator (2). The single AC generator (2) acts upon the DC input voltage to convert it to an alternating signal. As mentioned, this alternating signal may be at a higher frequency. This alternating signal— whether transformed or not—is then typically transmitted to a single signal rectifier (3). As those skilled in the art well understand, the single signal rectifier (3) acts to convert the alternating signal to DC. When the alternating signal created by the single AC generator (2) is a sine wave, this rectification takes a form as shown in FIG. 3. (Naturally, other waveforms are possible.) Since the waveform shown in FIG. 3 has 100% peak-to-peak ripple, it has been necessary in the prior art to filter this waveform so as to smooth the ripple and more closely approximate a steady state DC voltage. This has traditionally been accomplished by the use of a filter (4). As those skilled in the art well understand, filter (4) traditionally includes one or more capacitive or inductive elements so as to store energy and thus release it during times when the voltage appears low in the waveform. After the smoothing, a more steady state DC voltage can then be applied to the plasma processing chamber (5). As those skilled in the art well understand, the plasma processing chamber (5) contains at least one anode (6) and one cathode (7) so as to allow the creation of the plasma (8). This plasma (8) can then act on material within plasma processing chamber (5) to effect some type of processing on substrate (9).

Figure 2B:
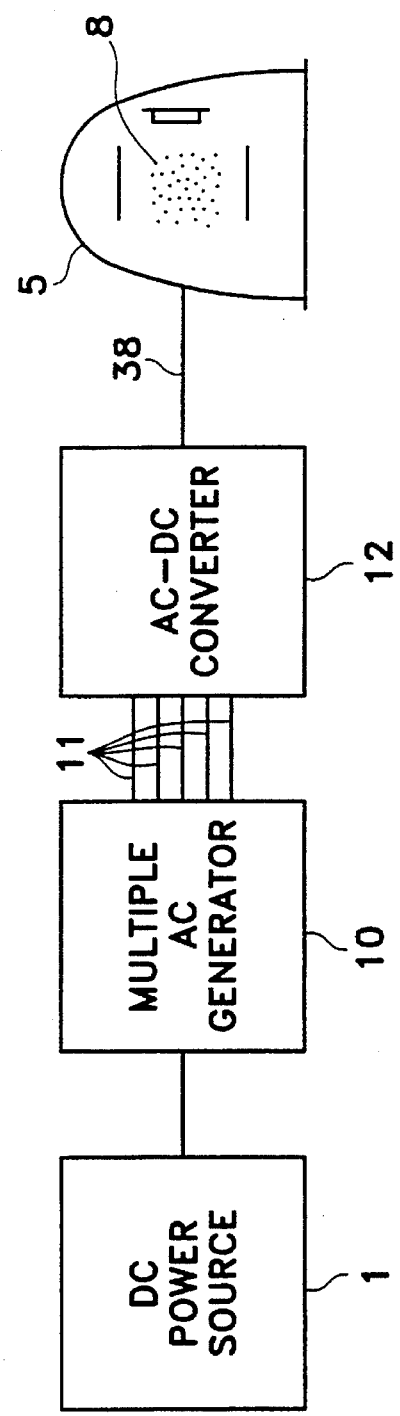
FIG. 2b is a schematic diagram of the basic components of a switch mode DC plasma processing system according to the present invention.

In sharp contrast to the arrangements typically used in the prior art, the present invention acts very differently in both the utilization of the DC input voltage as well as its supply after conversion to a DC output. As shown in FIG. 2b, DC power source (1) transmits its DC input voltage to a multiple AC generator (10). As its name implies, the multiple AC generator (10) acts to create multiple alternating signals (11). As mentioned earlier these signals may be transformed, however, for simplicity such as step is not shown in this figure. The multiple alternating signals (as one example five are shown in 2b) may then be output by the multiple AC generator (10) to an AC-DC converter (12). The AC-DC converter (12) then utilizes all signals to create a single DC output. This single DC output (31) will in many instances be sufficiently smooth so that it may be applied directly to the processing plasma (8).

Figure 1:
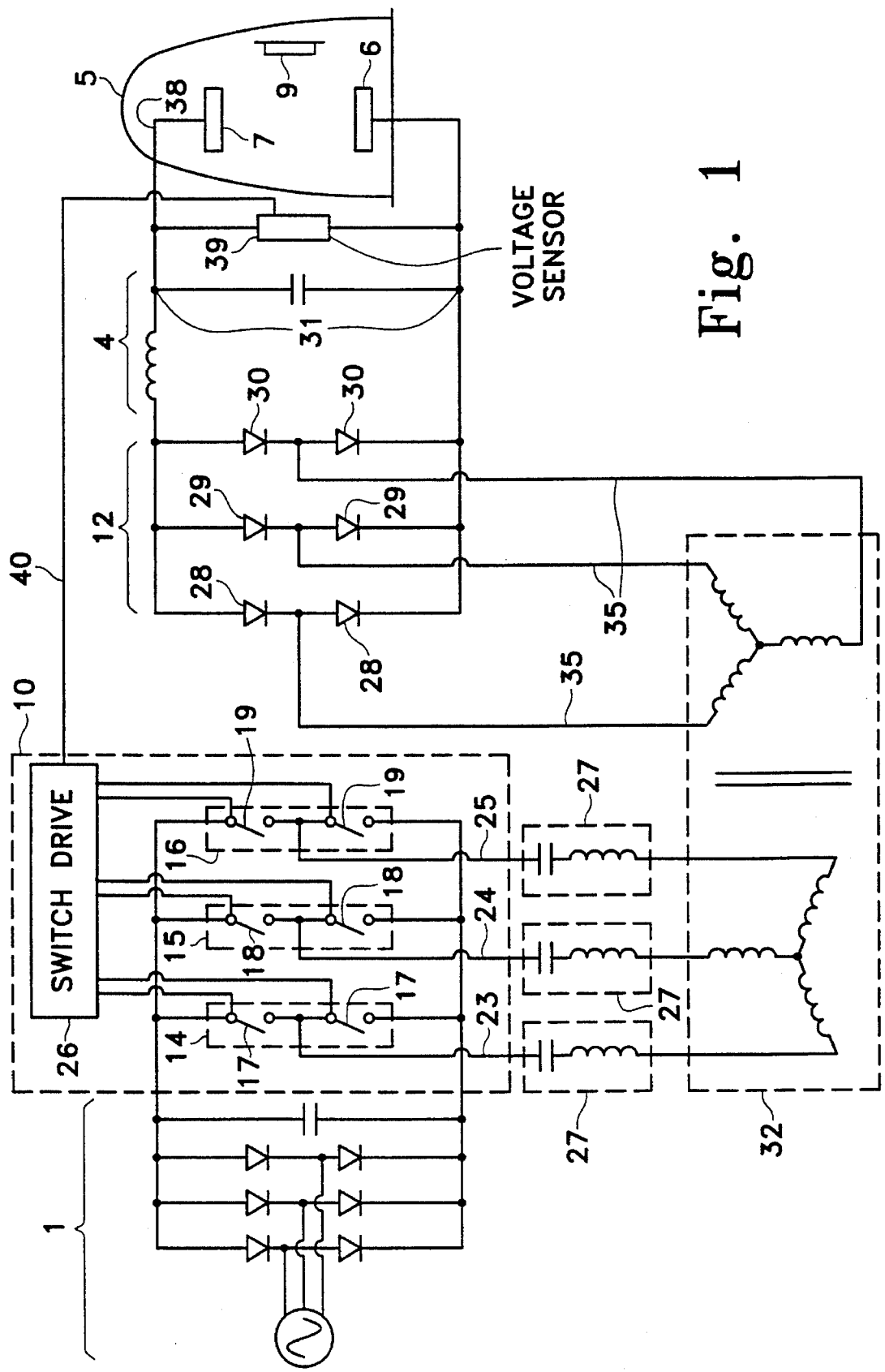
FIG. 1 is a circuit diagram of one overall system according to the present invention.

FIG. 1 shows one potential circuit arrangement according to the present invention. As shown, it can be seen that the DC power source (1) may actually accept and include some kind of alternating input such as single or multiple phase publicly supplied power which is then utilized and perhaps rectified through a diode arrangement as shown (for a single phase input) to create the DC input voltage. In sharp contrast to the approaches traditionally used by those skilled in this field, this DC input voltage is utilized in switching circuitry which acts to generate the multiple alternating signals desired. As mentioned, this is accomplished through the use of a multiple AC generator (10) such as the type shown in FIG. 1. While shown as some type of switching arrangement, it should be understood that all that is essential is that the system act so as to merely be responsive to the DC power source (1) in a manner which generates in any fashion multiple alternating signals. Thus, a variety of alternative designs are possible, the switching arrangement shown is but one possibility and should not be interpreted as limiting the type of design which would be encompassed by the general inclusion of a multiple AC generator (10).

As shown in FIG. 1, the switches shown are arranged so as to generate three different phases (as opposed to the five shown in FIG. 2b). As explained later, these switch circuits may be configured as half bridge circuits, but in FIG. 1 are configured as a three-phase full bridge attached to the DC input voltage. Importantly, it should be understood that the first, second, and third bridge switching circuits (14, 15, & 16) each act so as to create one of the multiple alternating signals (11) which are the output of the multiple AC generator (10).

As may be readily appreciated, each of the bridge switching circuits (14, 15, & 16) may have two bridge switches (17, 18, & 19) which are simultaneously controlled so as to act upon each bridge input in a manner which causes multiple square wave signals to exist. These multiple square wave signals are the result of switching the DC input voltage at various times in each of the switching circuits. They may be phased and may even have independent frequencies. The multiple square wave signals may be the multiple alternating signals desired or they may be further conditioned to create the multiple alternating signals as shown. Regardless, in this design the three bridge outputs (23, 24, & 25) are generated so as to provide the multiple alternating signals (11).

To achieve maximum benefit in most applications, this embodiment has been designed so that the multiple alternating signals (11) are phased with respect to each other. This is accomplished through delay circuitry or the use of a switch drive (26). As those skilled in the art readily understand, this switch drive (26) may be some type of time-based controller such as a ring counter and the like which acts to simultaneously drive first, second, and third switching circuits (14, 15, & 16). While separate controllers are of course possible as well as a great variety of other designs, the essence for this type of application would be that switch drive (26) act so as to cause each switch circuit to generate an alternating signal and preferably act so as to cause these alternating signals to be phased with respect to each other in instances where they have an identical frequency. This would be accomplished by sequentially activating the various switches. To the extent that three roughly sinusoidal alternating signals are desired, it may be preferable the first, second, and third pairs of bridge switches (17, 18, & 19) be activated at times which are roughly one half the period of each alternating signal. Thus, referring to first bridge switching circuit (14), it might be understood that one of the two first bridge switches (17) would be on for roughly one half of the period while the other would be off. In the next half period, the second of the switches (17) would be conducting while the other would not. Through this action each of the bridge switching circuits would act to create an alternating signal.

As those skilled in the art well understand, it can be desirable for control reasons as well as to help control electromagnetic interference to have an alternating signal which nearly sinusoidal. This can be accomplished through using a circuit which is oscillatory at the switching frequency. As shown in FIG. 1, the oscillatory circuit (27) may consist of merely an arrangement of reactive components which have the effect of rounding the multiple square waves caused by the various bridge switches. In this fashion the multiple square wave signals are applied to an oscillatory circuit (27) to make a resulting alternating signal which is smoother than that originally produced. Importantly it should be noted that the resulting alternating signal need not and in fact, will not be as close to a sine wave as possible. This is because while the components for a fixed oscillatory circuit (such as that shown) are typically chosen so as to cause resonance at a frequency which is different from the switching frequencies involved. As those skilled in the art understand, in this fashion greater control of the voltages is possible as well as the avoidance of unusually high voltages that might result in a true resonance situation. Regardless of the components chosen, their values will of course result in the oscillatory circuit (27) having some resonance frequency. This resonance frequency can then be varied as discussed later. Further, it should be understood that other types of switch mode designs are possible and can be utilized with the present invention beyond the resonance power supply discussed in detail here. Each of these are well within the skill of those in the art and could be easily implemented without undue experimentation. This would include but not be limited to pulse width modulation power supply designs such as synthesis type and the like.

As mentioned earlier, the multiple alternating signals (11) must be converted in some fashion to create a single DC output. This is accomplished through some type of AC-DC converter (12). As intended, this term encompasses any device which responds to or utilizes a signal which alternates (and may even be biased) and converts that signal to something more closely approximating a direct current. In its broadest sense, AC-DC converter (12) and the step of converting should be understood to encompass a great variety of different designs. It is intended to include a "black box" by analogy whereby an input is somehow utilized to create the appropriate output. Importantly it is not intended to mean that all portions of the signals are used or even that a reversal of some voltage existing in the alternating signal must exist. Further, the components utilized within AC-DC converter (12) may be switch based, diode based, or achieved in any other manner.

As shown in FIG. 1, the AC-DC converter (12) consists of three pairs of rectifying diodes (28, 29, & 30). As those skilled in the art would readily understand, these three pairs of diodes are arranged to act in a fashion which causes rectification or AC-DC conversion of the three multiple alternating signals (11). The arrangement shown essentially results in the selection of the highest of any of the three multiple alternating signals (11) as if they were previously rectified. In this fashion a low ripple DC waveform results as shown and discussed later with respect to FIGS. 4a–c.

As can be understood from the FIG. 1, the AC-DC converter (12) can have two potentially important characteristics. First, it may coincidentally rectify all three signals. By the aspect of being coincidental, it is meant that these signals are not merely separately rectified and then combined as separate DC inputs but rather are utilized as alternating inputs to create the single end result. Second, the AC-DC converter (12) shown has the characteristic of resulting in a single DC output. Again, each signal is not separately converted and then the resulting three DC signals somehow combined but rather the signals are coincidentally converted into a single DC output (31). Thus, the AC-DC converter (12) is responsive to the three bridge outputs (23, 24, & 25) in a manner which creates not three DC signals but rather one DC signal. It does not separately rectify signals and then combining those converted signals. While such an arrangement could, of course, be designed using the teachings of the present invention, it would not fall within the aspect of creating a single DC signal or the aspect of coincidentally rectifying the signals.

Figure 7:
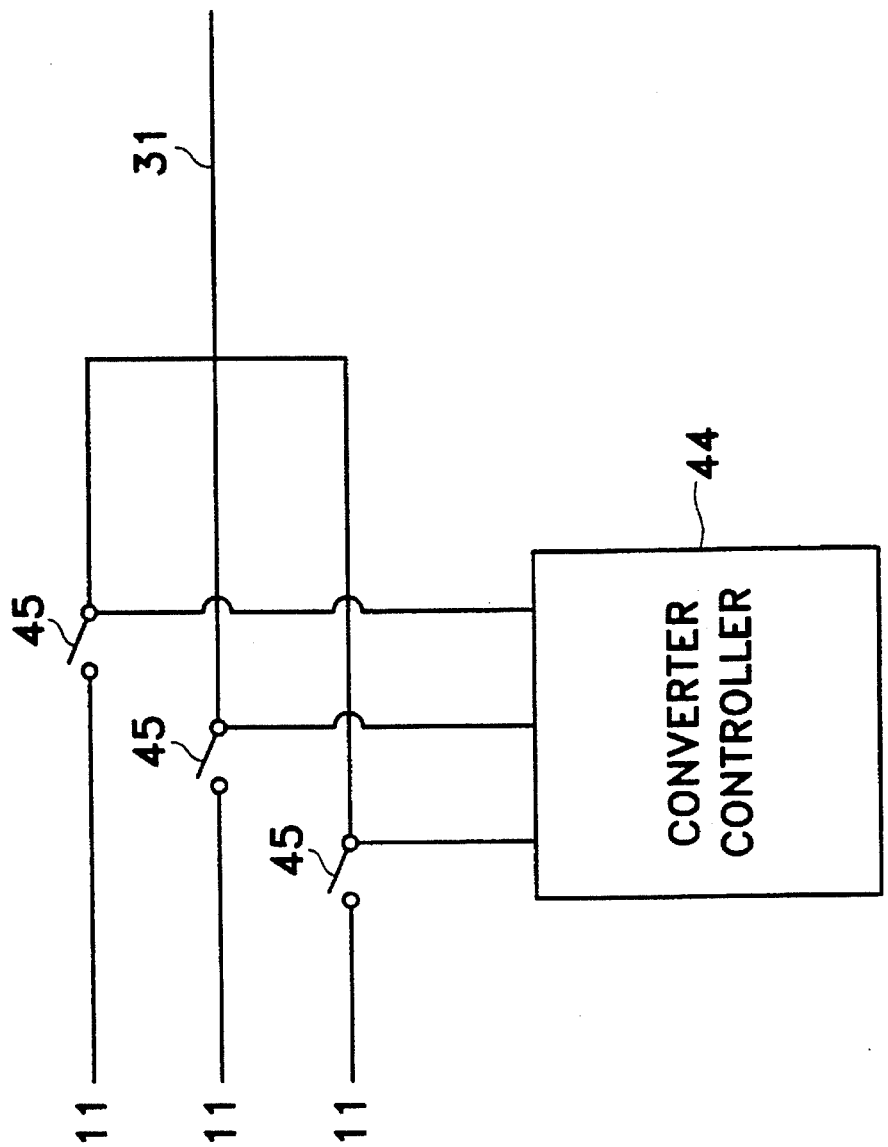
FIG. 7 is an alternative rectifier design which might be used to convert the multiple alternating signals to a single DC output.

It should be noted that the rectifier design can be of a great variety of arrangements, including synchronous or switching rectifiers among other types of designs. SCR's, traditional switches, FET and bipolar transistors and the like may also be used. In a synchronous rectifier, a switch-based arrangement is used whereby a timing controller acts to sequence the rectifier switches. As shown in FIG. 7, even a switch-based arrangement is possible whereby converter controller (44) would act to sequence converter switches (45). Through proper timing, portions of the multiple alternating signals (11) could be selectively passed through to create the DC output (31) as those skilled in the art would readily recognize. Further, the AC-DC converter (12) may add signals rather than just select portions of the signals or in some other fashion combine signals as well.

Figure 4B:
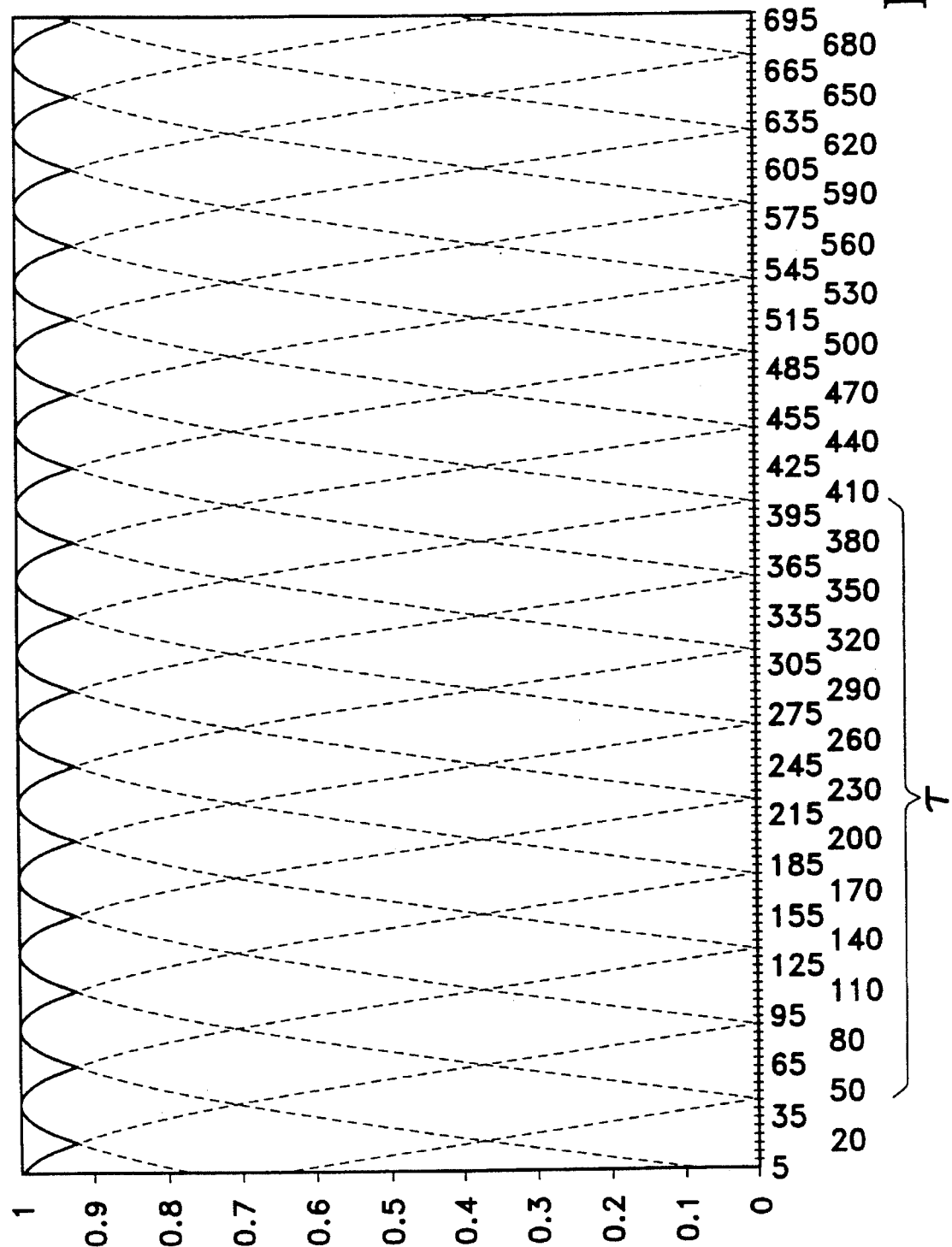

In order to achieve the optimum minimization of ripple, it may also be desirable to not only have the multiple alternating signals (11) to have the same frequency, but also to have a phase relationship. By this it is meant that the signals—they do indeed have the same frequency—may be phase shifted with respect to each other. In the event this phase relationship is selected to be a regular phase relationship (ie. 90 degrees, 120 degrees, or the like), the resulting ripple may be minimized. Some examples of this are shown in FIG. 4a–c. FIG. 4a shows the result of the type of AC-DC conversion which would exist from a system as shown in FIG. 1 when three phases were generated. By having a regular phase relationship between the three signals, namely, 120° spacing, the resulting ripple can be at a minimum percentage as well as regular. Naturally, any number of multiple alternating signals is possible. As shown in FIGS. 4b and 4c, four and five phased signals can be similarly combined. Most notably, as the number of phases is increased, the amount of ripple is reduced as well as its frequency is increased. Importantly it should be understood that the phase relationship between the various multiple alternating signals is dependent upon whether there is an even or odd number of signals. When there is an odd number of signals the phasing should be 360°/N (the number of phases generated); when there is an even number of signals the phasing should be 180°/N. In this fashion the peak to peak magnitude of the ripple will be minimized.

Although the three phase arrangement shown in FIG. 1 represents but one possible choice, it is believed that this particular arrangement may represent an excellent trade off between the practical and theoretical factors. By generating three multiple alternating signals (11) which are sequenced 120° apart, the peak-to-peak ripple can be reduced from 100% to about 13.4% with no filter. This represents about 5% RMS ripple for the three phase system. As a further advantage, the frequency of the ripple is increased to three times that of the alternating signal frequency. While naturally the ripple and the ripple frequency could be further improved it is believed that a three phase system may provide the point of most economic advantage for such a system.

As mentioned it is also possible to including some type of voltage transformation within the circuit. This is shown in FIG. 1. This voltage transformation could be accomplished through a single, combined core transformer device (32) as shown in FIG. 1 or by several separate core transformers which would constitute the transformer device. Further by utilizing the inductive element inherent in the transformer in oscillatory circuit (27), the inductive portion of the oscillatory circuit (27) may be reduced in value or even eliminated. In instances where voltage transformation is not necessary, isolation also can be achieved through such an arrangement. Regardless of the type of design chosen the transformer device (32) will provide first, second, and third transformer outputs (35, 36, & 37) which may then be the outputs which are converted to the DC through AC-DC converter (12). Through such an arrangement the first, second, and third transformer outputs (35) can be made to respectively correspond to the first, second, and third bridge outputs (23, 24, 25). Naturally, when transformers are included within the circuit, it may be important that the alternating signals alternate about zero so as to avoid saturation of any one transformer element. Further, in configuring the transformer certainly Y or delta configurations are possible. Both these configurations and the combined core transformer device are each well known to those skilled in the art.

Perhaps most notable in comparing the conceptual schematic diagrams shown in FIGS. 2a and 2b is the fact that the present invention in FIG. 2b does not show a filter element. This is a distinct advantage of the present invention for the reasons discussed earlier. Thus while those skilled in the art seemed to have assumed a requirement of a filter that had significant stored energy, the present invention shows how this filter may be either completely eliminated or greatly reduced. As shown in FIG. 2b, no filter element is included thus the single DC output is shown as being connected directly to the plasma processing chamber (5). This is done by utilizing a coupling (38) as some type of connection which does not have any substantial reactive component. Through this design, the system does not store substantially any energy after accomplishing the step of converting the alternating signals to a single DC output. Little or no stored energy exists after the AC-DC converter (12). While there still may remain some small amount of energy which is available from the circuit after the supply has been shut off, this small amount of energy exists primarily due to the optional step of transforming or isolating the voltage rather than as result of some effort to smooth the ripple. This energy is not an incident of and would not act to smooth the DC output. Thus one facet of the invention is a plasma processing system in which the step of transmitting the DC output from the AC-DC converter (12) consists essentially of a connection having substantially no reactive component.

Figure 5:
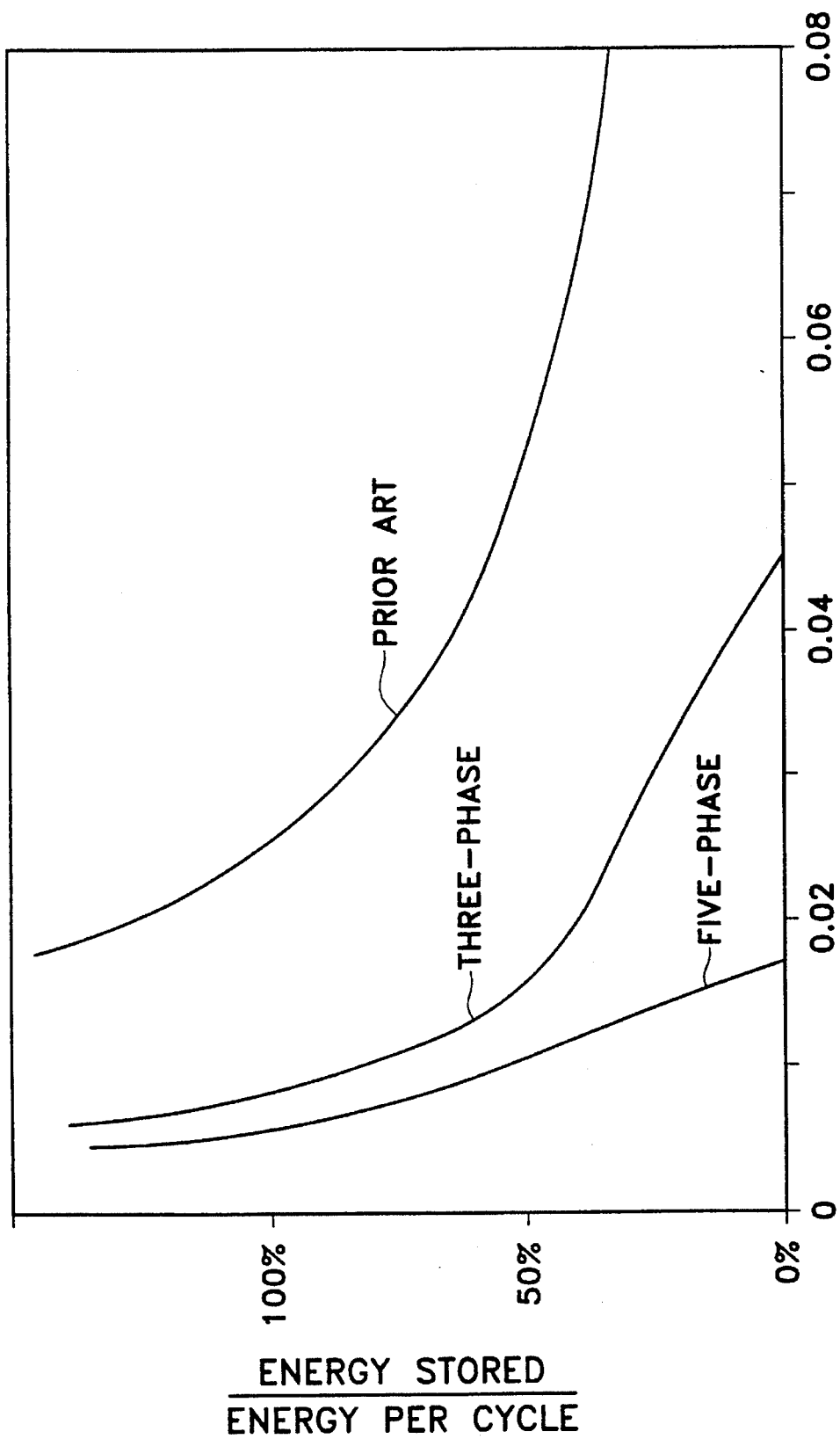
FIG. 5 is a conceptual graph showing the energy stored in a power supply using the single-phase prior art design compared to that of a three and five phase design according to the present invention.

As shown in FIG. 1 it can be seen that a filter element may also be included. One type of arrangement for this filter (4) is the series inductor and parallel capacitor arrangement as shown. Naturally other types of arrangements are also possible. Naturally any type of component which is capable of storing energy might also be used. In the event such a filter is included, however, through the present invention this filter may store an extremely reduced amount of energy compared to those traditionally utilized. This reduction in energy is shown graphically in FIG. 5. To make the graph independent of frequency the energy axis has been calculated to be the energy stored in the relevant portion of the power supply divided by the energy delivered by that power supply for each cycle of switch operation. As shown it can be seen that while the energy stored compared to the energy delivered per cycle (ie. during one period of the switching frequency) must be in the 50–100% range to keep the ripple factor below 5% RMS, for the present invention with three phases that amount can be nearly zero; in practice it can readily be held below about 1%. Not only does this have the advantage of drastically reducing the amount of energy which might be dumped into the plasma, but it also has the advantage of greatly reducing the delay in start up of the system since only very small elements need to be charged. This difference can also be dramatic, for instance, while traditional art designs might take 200 microseconds to reach full output, for the present invention this delay can be reduced to a few microseconds.

As mentioned earlier, the DC input voltage may be derived from one or more alternating line signals. In keeping with the AC-DC conversion aspects, it would naturally also be possible to utilize the three phase signals commonly available under the same concepts as that discussed with respect to the AC-DC converter (12). Perhaps surprisingly this aspect has apparently been used in such systems and yet it did not lead those skilled in the art to the type of arrangement of the present invention. As alluded to earlier, in accomplishing any AC-DC-AC-DC manipulation, it is generally desirable to increase the frequency of the intermediate alternating signals. For this reason it may be desirable to have substantially higher frequency than that of the original line input. While this may be any amount of increase, typically a substantially higher increase would be a frequency which is approximately orders of magnitude higher. Further, it can also be the case that the resulting intermediate frequency be selected to be higher than the audible range (about 20,000 hz).

Finally, it may be desirable to be able to control the voltage applied to the plasma (8). This may be easily accomplished in the present invention in a variety of ways as those skilled in the art would readily understand. For a feedback system to exist, voltage regulations can also include some type of voltage sensor (39). As shown in FIG. 1, this may be positioned as close to the plasma as possible for accuracy reasons. Voltage sensor (39) may be responsive to the processing voltage actually applied to plasma (8). Some type of signal could then be provided to allow a feedback voltage regulation to occur. This signal could then be used in at least three different fashions: frequency regulation, resonance regulation, or pulse width modulation.

As shown in FIG. 1 the frequency regulation mode would involve voltage sensor (39) to provide an input to some type of frequency controller. As shown the frequency controller might actually be the switch drive (26). By adjusting the frequency at which first, second, and third bridge switching circuits (14, 15, & 16) operate, the voltage could be varied due to the inherent resonance response of the oscillatory circuits (27). Through appropriate programming or design, switch drive (26) can be configured to serve as a variable frequency switch drive and thus could be responsive to the components which act as a frequency controller. In this fashion the drive or switching frequency could be varied while accomplishing the actual plasma processing. Naturally, the frequency controller or even the variable frequency switch drive could be either a separate component from or merely an integral portion of the switch drive (26).

Figure 6B:
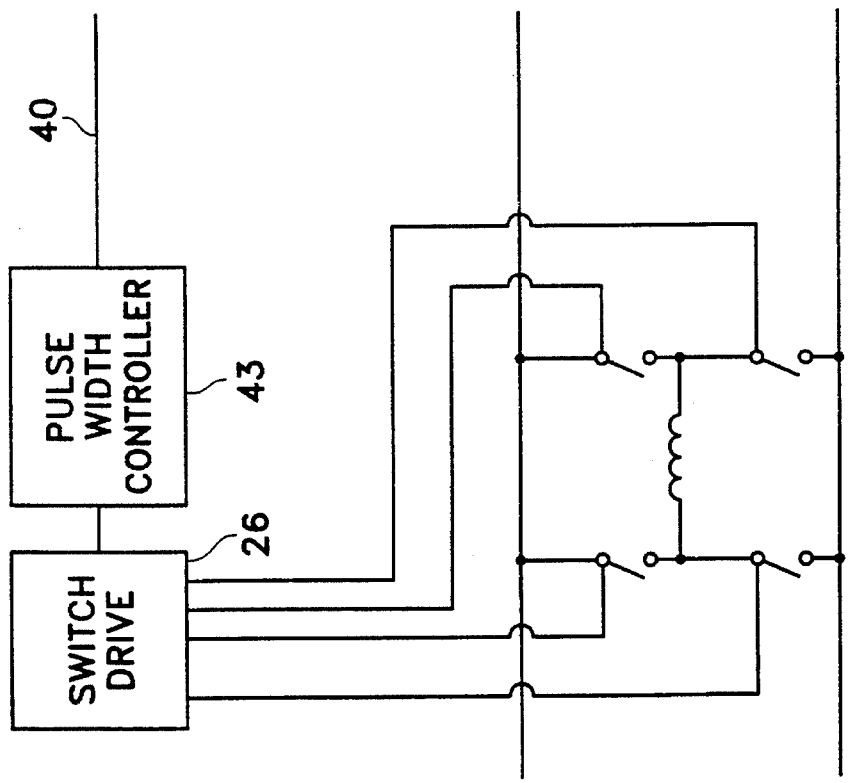
FIG. 6a & b are alternative bridge designs and also show the inclusion of voltage regulation elements which may be included in some embodiments.
Figure 6A:
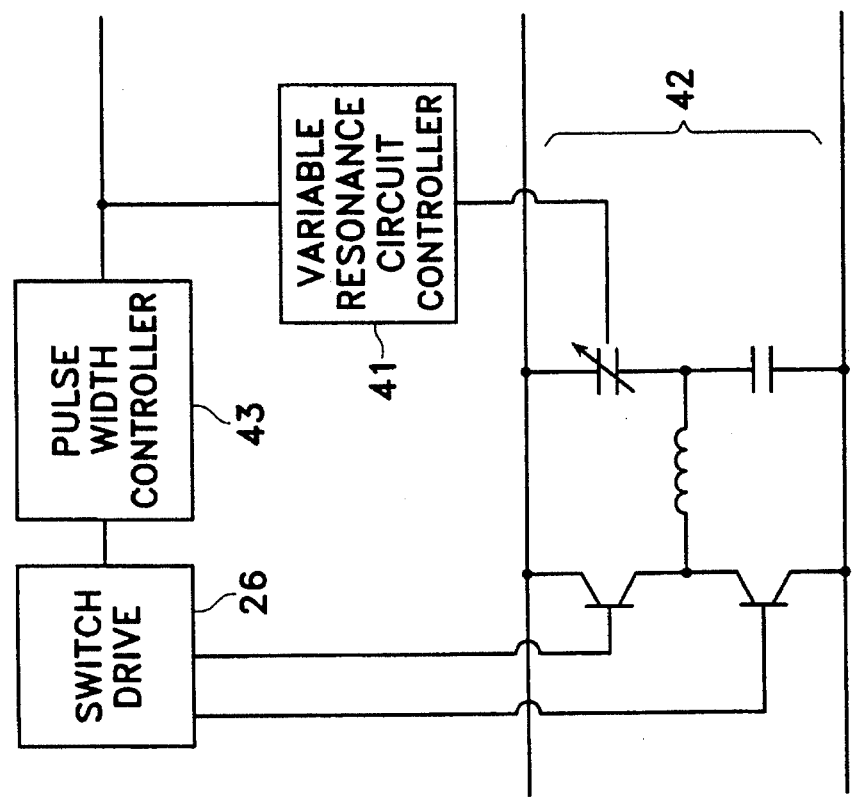

As an additional technique of varying the voltage applied to the plasma, regulation of the resonance frequency of the oscillatory circuit (27) can also be accomplished. This is shown in FIG. 6a with reference to a different half bridge arrangement for the bridge switching circuit than that shown in FIG. 1. As shown, the voltage sensor signal (40) may be provided as an input not only to switch drive (26) serving as a frequency controller, but it also might be provided as an input to a variable resonance circuit controller (41). This variable resonance circuit controller (41) could be connected to a variable resonance circuit (42) which would replace the traditional design such as the half bridge design shown in FIG. 1. By having some variable component in the variable resonance circuit (42) the resonance frequency of such a circuit—and thus the voltage produced by the circuit—could be varied. Thus the variable resonance controller (41) which act to would vary the inherent resonant frequency of the oscillatory circuits (27). Naturally this voltage regulation technique could be used by itself. As shown in FIG. 6a however, it is shown combined with other types of voltage regulation schemes.

As an additional technique of varying the voltage applied to the plasma, regulation of the resonance frequency of the oscillatory circuit (27) can also be accomplished. The voltage sensor signal (40) may be provided as an input not only to switch drive (26) serving as a frequency controller, but it also might be provided as an input to a variable resonance circuit controller circuit which would vary the inherent resonant frequency of the oscillatory circuits (27). By having some variable component in oscillatory circuits (27) the resonance frequency of such a circuit and thus the voltage produced by the circuit could be varied. Naturally this voltage regulation technique could be used by itself or combined with other types of voltage regulation schemes.

A third type of voltage regulation technique can be a pulse width modulation technique. Again by utilizing the voltage sensor signal (40), a pulse width controller could be fashioned to impact the signals which control the opening and closing of the bridge switches (17, 18, 19). In this fashion the width of the square wave signal and the amount of voltage resulting from the resonant circuit can be varied. Naturally, any of these arrangements can work for a full bridge circuit as well as a half bridge circuit. This is shown in FIG. 6b where both the switch drive (26) and the pulse width controller (43) act together to control the opening and closing of two pairs of switches for a full bridge circuit.

The foregoing discussion and the claims which follow describe the preferred embodiments of the present invention. Particularly with the respect to the claims it should be understood that changes may be made without departing from their essence. In this regard it is intended that such changes would still fall within the scope of the present invention. It simply is not practical to describe and claim all possible revisions to the present invention which may be accomplished. To the extent that such revisions utilize the essence of the invention each would naturally fall within the breath of protection accomplished by this patent. This is particularly true for the present invention since its basic concepts and understandings are fundamental in nature and can be applied in a variety of fields.

I claim:

1. A method of precisely processing a substrate by powering a DC processing plasma comprising the steps of:
    a. supplying a DC input voltage;
    b. generating multiple alternating signals from said DC input voltage;
    c. converting said alternating signals to a single DC output;
    d. applying said DC output to said processing plasma; and
    e. processing said substrate through action of said processing plasma.

2. A method of precisely processing a substrate by powering a DC processing plasma as described in claim I wherein said step of converting said alternating signals to a DC output comprises the step of coincidentally rectifying said multiple alternating signals.

3. A method of precisely processing a substrate by powering a DC processing plasma as described in claim 1 wherein said step of generating multiple alternating signals from said DC input voltage comprises the step of switching said DC input voltage.

4. A method of precisely processing a substrate by powering a DC processing plasma as described in claim 3 wherein said step of switching said DC input voltage comprises the step of simultaneously driving multiple switch circuits, 5. A method of precisely processing a substrate by powering a DC processing plasma as described in claim 4 wherein said step of simultaneously driving multiple switches results in multiple square wave signals each having a switching frequency and further comprising the step of applying each of said multiple square wave signals to a circuit which is oscillatory at said switching frequency.

6. A method of precisely processing a substrate by powering a DC processing plasma as described in claim 1, 4, or 5 wherein said multiple square wave signals have a regular phase relationship.

7. A method of precisely processing a substrate by powering a DC processing plasma as described in claim 6 wherein said step of simultaneously driving multiple switches results in an odd number of multiple square wave signals and wherein said regular phase relationship of said multiple square wave signals is 360 degrees divided by said odd number.

8. A method of precisely processing a substrate by powering a DC processing plasma as described in claim 6 wherein said step of simultaneously driving multiple switches results in an even number of multiple square wave signals and wherein said regular phase relationship of said multiple square wave signals is 180 degrees divided by said even number.

9. A method of precisely processing a substrate by powering a DC processing plasma as described in claim 1, 4, or 5 wherein said step of generating multiple alternating signals from said DC input voltage comprises the step of generating three alternating signals sequenced 120 degrees apart.

10. A method of precisely processing a substrate by powering a DC processing plasma as described in claim 9 wherein said step of converting said alternating signals to a DC output comprises the step of coincidentally rectifying said multiple alternating signals.

11. A method of precisely processing a substrate by powering a DC processing plasma as described in claim 1, 4, or 5 wherein said step of supplying a DC input voltage comprises the steps of:
 a. accepting at least one alternating input; and
 b. producing a DC input voltage from said alternating input.

12. A method of precisely processing a substrate by powering a DC processing plasma as described in claim 11 wherein said alternating input has an input frequency and wherein said multiple alternating signals have a frequency which is substantially higher than said input frequency.

13. A method of precisely processing a substrate by powering a DC processing plasma as described in claim 6 wherein said step of supplying a DC input voltage comprises the steps of:
 a. accepting at least one alternating input; and
 b. producing a DC input voltage from said alternating input.

14. A method of precisely processing a substrate by powering a DC processing plasma as described in claim 13 wherein said alternating input has an input frequency and wherein multiple alternating signals have a frequency which is substantially higher than said input frequency.

15. A method of precisely processing a substrate by powering a DC processing plasma as described in claim 9 wherein said step of supplying a DC input voltage comprises the steps of:
 a. accepting at least one alternating input; and
 b. producing a DC input voltage from said alternating input.

16. A method of precisely processing a substrate by powering a DC processing plasma as described in claim 15 wherein said alternating input has an input frequency and wherein multiple alternating signals have a frequency which is a substantially higher than said input frequency.

17. A method of precisely processing a substrate by powering a DC processing plasma comprising the steps of:
 a. supplying a DC input voltage;
 b. switching said DC input voltage to generate at least one alternating signal from said DC input voltage;
 c. converting said alternating signal to a DC output;
 d. applying said DC output directly to said processing plasma; and
 e. processing said substrate through action of said processing plasma.

18. A method of precisely processing a substrate by powering a DC processing plasma as described in claim 17 wherein said step of converting said alternating signal to a DC output comprises the step of coincidentally rectifying said multiple alternating signals.

19. A method of precisely processing a substrate by powering a DC processing plasma as described in claim 17 wherein said alternating signal has a switching frequency, wherein said step of switching said DC input voltage results in a square wave signal, and further comprising the step of applying said square wave signal to a circuit which is oscillatory at said switching frequency.

20. A method of precisely processing a substrate by powering a DC processing plasma as described in claim 1 wherein said step of applying said DC output to said processing plasma comprises the step of applying said DC output directly to said processing plasma.

21. A method of precisely processing a substrate by powering a DC processing plasma as described in claim 6 wherein said step of applying said DC output to said processing plasma comprises the step of applying said DC output directly to said processing plasma.

22. A method of precisely processing a substrate by powering a DC processing plasma as described in claim 10 wherein said step of applying said DC output to said processing plasma comprises the step of applying said DC output directly to said processing plasma.

23. A method of precisely processing a substrate by powering a DC processing plasma as described in claim 5 and further comprising the step of storing energy after accomplishing said step of converting said alternating signals to a single DC output.

24. A method of precisely processing a substrate by powering a DC processing plasma as described in claim 23 wherein said multiple alternating signals supply energy over one period of said switching frequency and wherein said step of storing energy comprises the step of storing no more than about 1% of said energy supplied by said multiple alternating signals over one period of said switching frequency.

25. A method of precisely processing a substrate by powering a DC processing plasma comprising the steps of:

a. supplying a DC input voltage;
b. switching said DC input voltage to generate at least one alternating signal;
c. converting said alternating signal to a DC output;
e. applying said DC output to said processing plasma wherein said step of applying said DC output to said processing plasma consists essentially of the step of transmitting said DC output to said processing plasma through a connection having substantially no reactive component; and
f. processing said substrate through action of said processing plasma.

26. A method of precisely processing a substrate by powering a DC processing plasma as described in claim 25 wherein said step of converting said alternating signal to a DC output comprises the step of coincidentally rectifying said multiple alternating signals.

27. A method of precisely processing a substrate by powering a DC processing plasma as described in claim 1 wherein said step of applying said DC output to said processing plasma consists essentially of the step of transmitting said DC output to said processing plasma through a connection having substantially no reactive component.

28. A method of precisely processing a substrate by powering a DC processing plasma as described in claim 6 wherein said step of applying said DC output to said processing plasma consists essentially of the step of transmitting said DC output to said processing plasma through a connection having substantially no reactive component.

29. A method of precisely processing a substrate by powering a DC processing plasma as described in claim 10 wherein said step of applying said DC output to said processing plasma consists essentially of the step of transmitting said DC output to said processing plasma through a connection having substantially no reactive component.

30. A method of precisely processing a substrate by powering a DC processing plasma as described in claim 25 wherein said alternating signal has a switching frequency, wherein said step of switching said DC input voltage results in a square wave signal, and further comprising the step of applying said square wave signal to a circuit which is oscillatory at said switching frequency.

31. A method of precisely processing a substrate by powering a DC processing plasma as described in claim 1 or 5 wherein said step of generating multiple alternating signals comprises the step of establishing a variable drive frequency and further comprising the step of varying said variable drive frequency while accomplishing said step of processing said substrate through action of said processing plasma.

32. A method of precisely processing a substrate by powering a DC processing plasma as described in claim 29 wherein said step of generating multiple alternating signals comprises the step of establishing a variable drive frequency and further comprising the step of varying said variable drive frequency while accomplishing said step of processing said substrate through action of said processing plasma.

33. A method of precisely processing a substrate by powering a DC processing plasma as described in claim 31 wherein said DC output applied to said processing plasma has a processing voltage and further comprising the step of sensing said processing voltage applied to said plasma and wherein said step of varying said variable drive frequency is accomplished in response to said step of sensing said processing voltage applied to said plasma.

34. A method of precisely processing a substrate by powering a DC processing plasma as described in claim 5 wherein said multiple square wave signals have a pulse width, wherein said step of generating multiple alternating signals further comprises the step of establishing a variable drive frequency and further comprising the steps of:
a. varying said variable drive frequency while accomplishing said step of processing said substrate through action of said processing plasma; and
b. modulating said pulse width while accomplishing said step of processing said substrate through action of said processing plasma.

35. A method of precisely processing a substrate by powering a DC processing plasma as described in claim 5 or 30 wherein said circuit which is oscillatory at said switching frequency has a resonance frequency and further comprising the step of varying said resonance frequency while accomplishing said step of processing said substrate through action of said processing plasma.

36. A method of precisely processing a substrate by powering a DC processing plasma as described in claim 35 wherein said DC output applied to said processing plasma has a processing voltage and further comprising the step of sensing said processing voltage applied to said plasma and wherein said step of varying said resonance frequency is accomplished in response to said step of sensing said processing voltage applied to said plasma.

37. A method of precisely processing a substrate by powering a DC processing plasma as described in claim 35 wherein said square wave signal has a pulse width and further comprising the step of modulating said pulse width while accomplishing said step of processing said substrate through action of said processing plasma.

38. A plasma processing system comprising:
a. DC power source which supplies a DC input voltage;
b. a multiple AC generator responsive to said DC power source and which outputs multiple alternating signals;
c. an AC to DC converter responsive to said multiple alternating signals and which has a single DC output;
d. a coupling connected to said DC output;
e. a plasma processing chamber connected to said coupling and which comprises:
1) an anode responsive to said coupling; and
2) a cathode responsive to said coupling.

39. A plasma processing system as described in claim 38 wherein said AC to DC converter comprises a rectifier responsive to each of said multiple alternating signals.

40. A plasma processing system as described in claim 38 wherein said multiple AC generator comprises:
a. a plurality of switch circuits responsive to said DC power source wherein each switch circuit acts upon said DC input voltage to create an alternating signal; and
b. at least one switch drive connected to said plurality of switch circuits and having a switching frequency.

41. A plasma processing system as described in claim 40 wherein said multiple AC generator further comprises at least one circuit which is oscillatory at the switching frequency and which is responsive to said alternating signal created by said switch circuit.

42. A plasma processing system as described in claim 41 wherein said plurality of switch circuits comprises a plurality of full bridge circuits.

43. A plasma processing system as described in claim 41 wherein said plurality of switch circuits comprises a plurality of half bridge circuits.

44. A plasma processing system as described in claim 40 or 43 wherein said multiple alternating signals have a regular phase relationship.

45. A plasma processing system as described in claim 44 wherein there are an odd number of multiple alternating signals and wherein the regular phase relationship of said multiple alternating signals is 360 degrees divided by the number of said multiple alternating signals.

46. A plasma processing system as described in claim 44 wherein there are an even number of multiple alternating signals and wherein the regular phase relationship of said multiple alternating signals is 180 degrees divided by the number of said multiple alternating signals.

47. A plasma processing system as described in claim 40 wherein said switching frequency has a switching time period and wherein said multiple AC generator comprises:
   a. a first bridge switching circuit having a first bridge input attached to said DC input voltage, having at least two first bridge switches which are responsive to said switch drive so as to be sequentially activated at times which differ by one half of said switching time period, and having a first bridge output;
   b. a second bridge switching circuit having a second bridge input attached to said DC input voltage, having at least two second bridge switches which are responsive to said switch drive so as to be sequentially activated at times which differ by one half of said switching time period, and having a second bridge output;
   c. a third bridge switching circuit having a third bridge input attached to said DC input voltage, having at least two third bridge switches which are responsive to said switch drive so as to be sequentially activated at times which differ by one half of said switching time period, and having a third bridge output, and wherein said first, second, and third bridge switching circuits are sequenced 120 degrees apart; and
   d. a rectifier which is responsive to said first, second, and third bridge outputs.

48. A plasma processing system as described in claim 47 and further comprising a transformer device having three transformer outputs which correspond to said first, second, and third bridge outputs and to which said rectifier is responsive.

49. A plasma processing system as described in claim 47 wherein each said bridge switching circuit comprises:
   a. a circuit which is oscillatory at the switching frequency; and
   b. a half bridge circuit.

50. A plasma processing system as described in claim 47 wherein each said bridge switching circuit comprises:
   a. a circuit which is oscillatory at the switching frequency; and
   b. a full bridge circuit.

51. A plasma processing system as described in claim 38 or 40 wherein said DC power source comprises:
   a. at least one alternating inputs; and
   b. at least one rectifier responsive to said alternating input.

52. A plasma processing system as described in claim 49 or 50 wherein said DC power source comprises:
   a. at least one alternating input having an input frequency; and
   b. at least one rectifier responsive to said alternating input; and wherein said switching frequency is a substantially higher frequency than said input frequency.

53. A plasma processing system as described in claim 40 and further comprising a filter connected to said single DC output.

54. A plasma processing system as described in claim 53 wherein said filter is capable of storing energy, wherein said multiple alternating signals supply energy over one period of said switching frequency, and wherein the energy capable of being stored by said filter is no more than about 1% of the energy supplied by said multiple alternating signals over one period of said switching frequency.

55. A plasma processing system comprising:
   a. DC power source which supplies a DC input voltage;
   b. at least one switch circuit responsive to said DC power source wherein said switch circuit acts upon said DC input voltage to create an alternating signal;
   c. at least one switch drive connected to said switch circuit and having a switching frequency;
   d. an AC to DC converter responsive to said alternating signal and which has a DC output;
   e. a coupling connected to said DC output and which consists essentially of a connection having substantially no reactive component;
   f. a plasma processing chamber connected to said coupling and which comprises:
      1) an anode responsive to said coupling; and
      2) a cathode responsive to said coupling.

56. A plasma processing system as described in claim 38 or 40 wherein said coupling consists essentially of a connection having substantially no reactive component.

57. A plasma processing system as described in claim 44 wherein said coupling consists essentially of a connection having substantially no reactive component.

58. A plasma processing system as described in claim 52 wherein said coupling consists essentially of a connection having substantially no reactive component.

59. A plasma processing system as described in claim 55 wherein said switch circuit comprises a circuit which is oscillatory at the switching frequency.

60. A plasma processing system as described in claim 40, 41, or 55 wherein said DC output has a processing voltage and further comprising:
   a. a frequency controller; and
   b. a variable frequency switch drive responsive to said frequency controller.

61. A plasma processing system as described in claim 58 wherein said DC output has a processing voltage and further comprising:
   a. a frequency controller; and
   b. a variable frequency switch drive responsive to said frequency controller.

62. A plasma processing system as described in claim 60 and further comprising a voltage sensor responsive to said processing voltage and to which said frequency controller is responsive.

63. A plasma processing system as described in claim 60 wherein said switch circuit creates a square wave signal having a pulse width and further comprising a pulse width controller to which said switch circuit is responsive.

64. A plasma processing system as described in claim 41 or 59 and further comprising a variable resonance circuit controller, wherein said circuit which is oscillatory at the switching frequency comprises a variable resonance circuit which is responsive to said variable resonance circuit controller.

65. A plasma processing system as described in claim 64 wherein said DC output has a processing voltage and further comprising a voltage sensor responsive to said processing voltage and to which said variable resonance circuit controller is responsive.

66. A plasma processing system as described in claim 65 wherein said switch circuit creates a square wave signal having a pulse width and further comprising a pulse width controller to which said switch circuit is responsive.

* * * * *